(12) United States Patent
Forrest et al.

(10) Patent No.: US 9,653,709 B2
(45) Date of Patent: May 16, 2017

(54) OPTOELECTRONIC DEVICE FORMED WITH CONTROLLED VAPOR FLOW

(71) Applicant: The Regents of the University of Michigan, Ann Arbor, MI (US)

(72) Inventors: Stephen R. Forrest, Ann Arbor, MI (US); Gregory McGraw, Yardley, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 145 days.

(21) Appl. No.: 13/774,225

(22) Filed: Feb. 22, 2013

(65) Prior Publication Data

US 2014/0138629 A1   May 22, 2014

Related U.S. Application Data

(60) Provisional application No. 61/728,358, filed on Nov. 20, 2012.

(51) Int. Cl.
*H01L 51/56* (2006.01)
*H01L 51/52* (2006.01)
(Continued)

(52) U.S. Cl.
CPC ............. *H01L 51/56* (2013.01); *C23C 14/04* (2013.01); *C23C 14/12* (2013.01); *C23C 14/24* (2013.01);
(Continued)

(58) Field of Classification Search
CPC .......................................... H01L 51/52–51/56
(Continued)

(56) References Cited

U.S. PATENT DOCUMENTS 5,701,055 A * 12/1997 Nagayama et al. .......... 313/504
7,307,381 B2 * 12/2007 Ito et al. ...................... 313/506
(Continued)

FOREIGN PATENT DOCUMENTS

JP   H08315981 A   11/1996
JP   10230193 A    9/1998
(Continued)

OTHER PUBLICATIONS

Gregory J. McGraw and Stephen R. Forrest; "Vapor-Phase Microprinting of Multicolor Phosphorescent Organic Light Emitting Device Arrays", Advanced Materials; wileyonlinelibrary.com; Nov. 29, 2012, pp. 1-6 Ann Arbor, Michigan.
(Continued)

*Primary Examiner* — Joseph L Williams
(74) *Attorney, Agent, or Firm* — Reising Ethington P.C.

(57) ABSTRACT

An organic optoelectronic device (OED) includes a plurality of OED cells separated by a vapor flow barrier that extends away from a substrate surface. The vapor flow barrier partially defines an OED cell area and helps prevent stray organic material deflected away from the substrate surface during deposition from being deposited outside the cell area. An organic vapor jet (OVJ) print head can be used to deposit organic material along the vapor flow barrier and may include one or more features configured to capture some of the stray organic material. A method that includes use of vapor flow barriers and/or capturing stray organic material can facilitate high-density printing of OED cells such as OLEDs with sharply defined edges and without cross-contamination among adjacent cells.

17 Claims, 2 Drawing Sheets

(51) Int. Cl.
  *C23C 14/04* (2006.01)
  *C23C 14/12* (2006.01)
  *C23C 14/24* (2006.01)
  *H01L 51/00* (2006.01)
  *H01L 27/32* (2006.01)

(52) U.S. Cl.
  CPC ....... *H01L 51/0011* (2013.01); *H01L 27/3211* (2013.01); *H01L 51/0005* (2013.01)

(58) Field of Classification Search
  USPC .................................................. 313/504–506
  See application file for complete search history.

(56) References Cited

U.S. PATENT DOCUMENTS

| | | | |
|---|---|---|---|
| 2002/0064966 A1* | 5/2002 | Seki et al. | 438/780 |
| 2002/0074936 A1* | 6/2002 | Yamazaki et al. | 313/504 |
| 2003/0127656 A1* | 7/2003 | Aizawa et al. | 257/79 |
| 2006/0144276 A1 | 7/2006 | MacPherson | |
| 2007/0001595 A1* | 1/2007 | Nakagawa | 313/506 |
| 2007/0103062 A1* | 5/2007 | Jung et al. | 313/504 |
| 2007/0200488 A1* | 8/2007 | Ito | 313/500 |
| 2009/0195144 A1* | 8/2009 | Kitabayashi | 313/503 |
| 2010/0104753 A1* | 4/2010 | Forrest et al. | 427/255.6 |
| 2014/0008642 A1* | 1/2014 | Morita et al. | 257/40 |

FOREIGN PATENT DOCUMENTS

| | | |
|---|---|---|
| JP | 2002164181 A | 6/2002 |
| WO | WO0326359 A1 | 3/2003 |
| WO | WO2011043566 A2 | 4/2011 |

OTHER PUBLICATIONS

Japanese Office Action in Japanese with English summary for JP application No. 2013-232880, dated Jan. 23, 2017, 11 pages.

* cited by examiner

OPTOELECTRONIC DEVICE FORMED WITH CONTROLLED VAPOR FLOW

This application claims the benefit of U.S. Provisional Application No. 61/728,358, filed Nov. 20, 2012, the entire contents of which are hereby incorporated by reference.

JOINT RESEARCH AGREEMENT

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

TECHNICAL FIELD

This disclosure relates to optoelectronic devices and, in particular, to optoelectronic devices constructed using vapor printing.

BACKGROUND

Various techniques have been developed for depositing and/or patterning organic materials on a substrate for use in constructing organic optoelectronic devices such as organic light emitting diodes (OLEDs), organic phototransistors, organic photovoltaic (PV) cells, or organic photodetectors. These techniques include vacuum thermal evaporation, solution processing, and organic vapor phase deposition, along with printing techniques such as inkjet printing, nozzle printing, thermal vapor jet printing, and organic vapor jet printing (OVJP). In some applications, it may be desired to deposit more than one type or composition of organic material so that adjacent portions of deposited material have different compositions.

SUMMARY

In accordance with one embodiment, an organic optoelectronic device (OED) includes a substrate having an OED cell support surface and an OED cell located at an OED cell area along the support surface. The OED cell includes a layer of small-molecule organic material arranged between first and second electrodes. The OED also includes a vapor flow barrier extending away from the support surface alongside the OED cell. The barrier is arranged to contain the small-molecule organic material within the OED cell area.

In accordance with another embodiment, a method of making an organic OED includes the steps of: (a) providing a substrate having a support surface and a vapor flow barrier that extends away from the support surface; and (b) directing a vaporized organic electroluminescent material toward the support surface along one side of the vapor flow barrier so that at least some of the vaporized material is prevented from flowing to an opposite side of the vapor flow barrier.

In accordance with another embodiment, a method of making an organic OED includes the steps of: directing a vaporized organic electroluminescent material toward a pre-defined cell area of an OED cell support surface of a substrate such that at least some of the organic material is deflected away from said surface; and (b) capturing at least some of the deflected organic material so that it is not deposited on the substrate outside the pre-defined cell area.

BRIEF DESCRIPTION OF THE DRAWINGS

Preferred exemplary embodiments will hereinafter be described in conjunction with the appended drawings, wherein like designations denote like elements, and wherein.

DETAILED DESCRIPTION OF THE ILLUSTRATED EMBODIMENT(S)

An organic optoelectronic device (OED) can be constructed by vapor printing the organic layers of adjacent OED cells at a relatively high areal density. The high-density printing is enabled by controlling the flow of the organic vapor-containing gas after it impinges the surface of the substrate over which the organic material is to be deposited. This flow control may be achieved by providing vapor flow barriers along the substrate surface to at least partially define the area of each individual cell and/or by capturing at least a portion of stray organic material deflected away from the substrate surface. The tightly-packed OED cells can thus be produced with sharply defined edges as well. While presented below in the context of arrays of OLEDs, with potential commercial applicability in OLED devices such as high-definition flat panel displays, the methods and structures described below are suitable for use with any vapor printing process, particularly where it is desired that adjacent OED cells have optoelectric layers with compositions different from one another.

Figure 1:
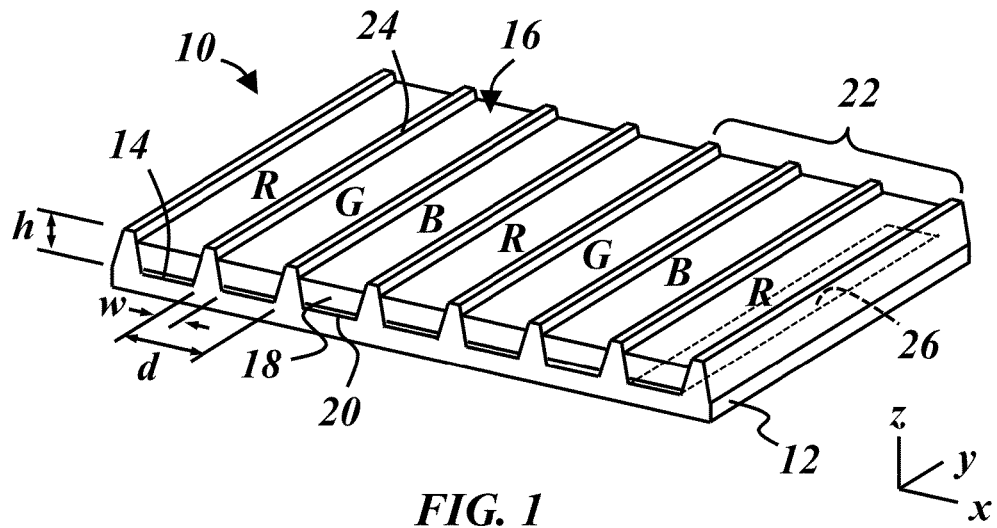
FIG. 1 is a perspective view of an embodiment of an optoelectronic device (OED) with vapor flow barriers arranged between adjacent OED cells.

With reference to FIG. 1, there is shown an organic optoelectronic device 10 according to one embodiment. The device includes a substrate 12 having an OED support surface 14 and a plurality of OED cells 16 arranged along the support surface 14. In this particular example, each OED cell 16 is an organic light-emitting diode that includes a layer of organic material 18 sandwiched and located between a first or bottom electrode 20 and a second or top electrode (omitted in FIG. 1). The organic layer 18 of each OLED is formed from a material that may be selected from known electroluminescent organic materials that emit light when a voltage is applied across the thickness of the layer via the electrodes. At least one of the electrodes or electrode layers of each cell 16 may be transparent to allow the transmission of light from the organic layer 18. In the illustrated example, adjacent OLEDs 16 have organic layers 18 with compositions that are different from each other. For example, the OLEDs identified in FIG. 1 as B have organic layers with a different composition from the organic layers of the adjacent OLEDs identified as R or G. The RGB convention shown in FIG. 1 is associated with three-color flat panel displays (red-green-blue). Each set of three consecutive RGB cells 16 may represent a single pixel 22 of the device 10, with each individual cell 16 representing a subpixel. The device 10 may include additional pixels 22 arranged along the x- and/or y-directions, and each pixel may include any number of subpixels. In one example, individual subpixels of an OLED display device can range in size from 30 μm to 100 μm, depending on the overall size and resolution of the display.

The device 10 also includes one or more vapor flow barriers 24. Each of the vapor flow barriers 24 extends away from the support surface 14—in the z-direction in FIG. 1. Each barrier 24 also extends between adjacent cells 16 to separate the respective organic layers 18 of each cell from each other. In addition to separating the organic layers 18 of adjacent cells 16 in the finished device 10, the barriers 24 can also help prevent different organic materials of the individual layers from mixing or cross-contaminating one another during deposition. The vapor flow barriers 24 can be formed over the substrate support surface 14 from inert materials such as polymers or Si-based materials like $SiO_2$ using conventional patterning techniques such as photolithography. The barriers 24 can be formed over an existing substrate 12 or formed together with the substrate as a monolithic structure, and they may be formed directly on top of the substrate surface 14, as shown, or over the top of the bottom electrode layer 20, which could be a continuous layer in the x-direction for the adjacent pixels 22 shown.

Each barrier 24 partially defines a cell area 26 along the substrate support surface 14 for each cell 16 and is arranged to contain the organic material used to form the organic layer 18 within the OED cell area. Thus, a given barrier 24 may function to separate different organic materials during and after deposition and/or to provide a distinct edge or boundary for a particular OED cell even when there is not another OED cell on the opposite side of the barrier. In the context of vapor printing, vapor flow barriers 24 may thus separate adjacent printed areas or separate printed areas from non-printed areas. The device 10 may also include additional barriers arranged perpendicular to those illustrated (e.g., lengthwise in the x-direction) to further define each cell area 26. Each vapor flow barrier 24 has a characteristic height h, width w, and distance d between adjacent barriers or cells 16. Each of these characteristic dimensions may be uniform among all of the barriers 24 of the device, but this is not necessary in all cases. The height h of each barrier 24 may range anywhere from 0.5 μm to 4.0 μm and is preferably in a range from 1.0 μm to 3.0 μm. In one embodiment the height of each barrier 24 is in a range from 1.5 μm to 2.5 μm, or the barriers of the device have an average height of about 2.0 μm. The height h may depend on the specific application and may take other factors into account such as the thickness of the layers of the OED cells, the distance of the deposition device from the substrate surface during material deposition, processing conditions such as vapor velocity and pressure, limitations on the patterning technique used to form the barriers, etc. The height h may be sufficiently large to reduce or prevent stray organic material from being deposited over unintended cell areas. Generally, it may be desirable to minimize the width w and spacing distance d. A smaller width allows for adjacent cells 16 to be located closer together, and a smaller distance d, or distance between subpixels, allows for overall higher resolution devices to be constructed. Minimum values for these dimensions may be subject to limitations of the method(s) used to form the barriers. A typical value for the distance d is about 50 μm in present-day high-definition display applications, and, as is subsequently described by way of example, a width w of about 10 μm is suitable. But these values are non-limiting.

Figure 2:
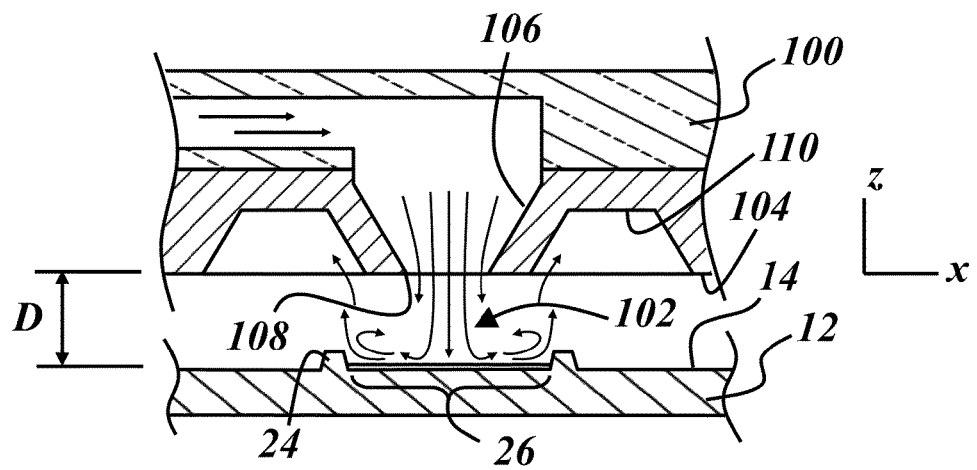
FIG. 2 is a cross-sectional view of a vapor printing process, showing a portion of an OVJ print head with a nozzle directing organic vapor-laden gas toward a substrate with vapor flow barriers.

FIG. 2 illustrates a vapor printing process as used to deposit optoactive organic materials, such as electroluminescent organic materials, over a substrate surface. Vapor printing techniques generally deliver the desired organic material to the substrate in vapor form by way of a heated and inert carrier gas. The organic material is solid at typical room and OLED operating temperatures and is heated to the vapor state and allowed or caused to flow with the carrier gas to be directed at the substrate. A dopant may also be added to the organic vapor-laden gas mixture. The vaporized organic material solidifies on contact with the cooler substrate and is thereby deposited on or over the substrate. Thus, vapor printing is typically not compatible with polymeric or other high molecular weight organics that may be more commonly used in liquid printing methods such as inkjet printing. Such materials often begin to degrade at temperatures lower than their vaporization temperature. The organic materials used in vapor printing techniques may be referred to as small-molecule organics, which typically have a molecular weight less than about 1000 g/mole.

In the illustrated process, an organic vapor jet print head 100 is shown in cross-section directing a jet 102 of organic vapor-containing gas toward a portion of the substrate 12, such as that of FIG. 1, for deposition of the organic material thereon. The print head 100 has a face 104 opposing and spaced from the substrate surface 14 by a distance D and includes a nozzle 106 through and from which the jet 102 emanates. The illustrated nozzle 106 is a convergent nozzle with a throat 108 at the face 104 of the print head 100. Other embodiments may include a nozzle with a divergent portion such that the throat of the nozzle is located farther away from the substrate surface 14 than is the face 104 (i.e., the distance to the throat of the nozzle is greater than D). While FIG. 2 shows only a single nozzle 106 directing a jet 102 of gas toward the substrate 12, the print head 100 may include a plurality of nozzles arranged side-by-side and/or as an array of nozzles, and each individual nozzle may direct the same or different organic vapor-containing gas toward the substrate as any of the other nozzles. For example, to produce the device 10 of FIG. 1, the print head 100 may include three or six nozzles arranged side-by-side with each set of three consecutive nozzles configured to direct three different organic vapor-containing gas compositions—corresponding to red, green, and blue electroluminescent organic materials—toward adjacent and consecutive OLED or OED cell areas.

As shown schematically by the arrows representing gas flow in the print head 100 and between the print head and the substrate, the jet of gas 102 is forced to change direction when it impinges the support surface 14 of the substrate 12. Thus, the gas flow at and near the surface 14 has components in the x and y directions (only the x-direction is shown in FIG. 2). The vapor flow barriers 24 interrupt the horizontal components of the gas flow field at the edges or boundaries of the OED cell area 26, redirecting the gas so that it has a vertical component. The gas may contain organic material that did not sufficiently cool for deposition on the substrate in the pre-defined area 26, and the vapor flow barrier 24 helps to keep the organic material generally over the cell area 26 by blocking or preventing the vapor-laden gas from traveling over adjacent cell areas. The vapor flow barriers 24 thus provide one manner by which the flow of vapor-laden gas from the print head 100 can be advantageously altered and/or controlled.

The illustrated OVJ print head 100 also includes features 110 configured to capture at least some of the undeposited or stray organic material. In this example, the features 110 are recesses or grooves formed in the face 104 of the print head 100 alongside the nozzle 106. In this particular example, the angled inner surfaces of the nozzle 106 are parallel with surfaces of the recess 110. These features 110 can provide additional surface area along which stray organic material can be deposited so that it is not deposited over unwanted cell areas. Alternatively or additionally, the features 110 may include or be in the form of vents that act as fluid flow passages through which undeposited organic material and the carrier gas can flow. For example, the print head 100 or other OVJ printer component may be equipped to actively draw any stray organics away from the gap between the face 104 of the print head and the substrate 12, via vacuum or other means. These print head features 110 thus provide another manner in which the flow of vapor-laden gas from the print head 100 can be advantageously altered and/or controlled.

Figure 3:
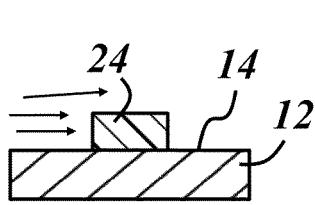
FIG. 3 is a cross-sectional view of a vapor flow barrier having a rectangular profile.
Figure 4:
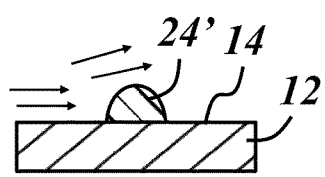
FIG. 4 is a cross-sectional view of a vapor flow barrier having a curved profile.
Figure 5:
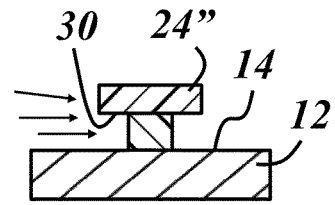
FIG. 5 is a cross-sectional view of a vapor flow barrier including an undercut.

The illustrated vapor flow barriers 24 have a slightly tapered cross-section, with a base or basal end of each barrier having a width w (see FIG. 1) and a corresponding tip or distal end having a width less than w. Other vapor flow barrier profiles may be employed, however. For example, vapor flow barriers 24 may have a rectangular cross-section as shown in FIG. 3. Rectangular cross-sections may be the least complex to fabricate, and their simplicity may be advantageous. In another example, vapor flow barriers 24' can have a curved profile, one example of which is shown in FIG. 4. Curved profiles as used with the vapor flow barriers may provide adequate deflection of stray organic material toward a capturing or getter feature of the print head (such as features 110 of FIG. 2) while providing smoother fluid flow and possibly minimizing eddys and other highly turbulent flow areas. FIG. 5 illustrates yet another example of a vapor flow barrier 24" with a profile having an undercut feature 30. An undercut feature 30 is present when some portion of the barrier 24" has a greater width than another portion of the barrier that is closer to the substrate surface, or when the barrier includes surface normals with a component in the vertical direction toward the substrate surface. The undercut feature 30 can provide an area of stagnant gas flow above the substrate surface that may help sequester stray organic material. Any of these and other barrier profile shapes may be fabricated by known techniques.

Accordingly, one embodiment of a method of making an organic OED comprises directing two different jets of gas toward the OED cell support surface, where one jet of gas is directed along one side of the vapor flow barrier, and the other jet of gas is directed along an opposite side of the vapor flow barrier. Each of the two different jets of gas includes a vaporized organic material that is optoelectric (e.g. electroluminescent) when in solid form, and the organic material in each of the two different jets of gas is different in composition. The vapor barrier separates the two different organic materials with one composition of organic material on the one side of the barrier and another composition of organic material on the opposite side of the barrier. Both jets of gas may be directed toward the substrate and along the barrier simultaneously or sequentially. For example, an OVJ print head may include side-by-side nozzles capable of simultaneous deposition of different organic materials on opposite sides of the barrier. The print head could also include multiple arrays of nozzles with each array configured to deposit a different organic material along the substrate and/or with each array staggered along the print head so that the deposition of one composition follows behind the deposition of another different composition.

The method may further include capturing stray organic material via a feature formed in the print head, such as a recess, vent, fluid flow passage, getter coating, or other feature. Where a plurality of nozzles is provided, for example in an OVJ print head, such capturing features may be located between adjacent nozzles. The method may include the use of either one or both of the above-described vapor flow barriers or the capturing features. Each of these structures functions to advantageously interrupt, control, or otherwise alter the gas flow field between the OVJ print head and the substrate to lessen, minimize, or eliminate the potential for cross-contamination of the organic materials of adjacent OED cells, such as OLEDs.

Figure 6:
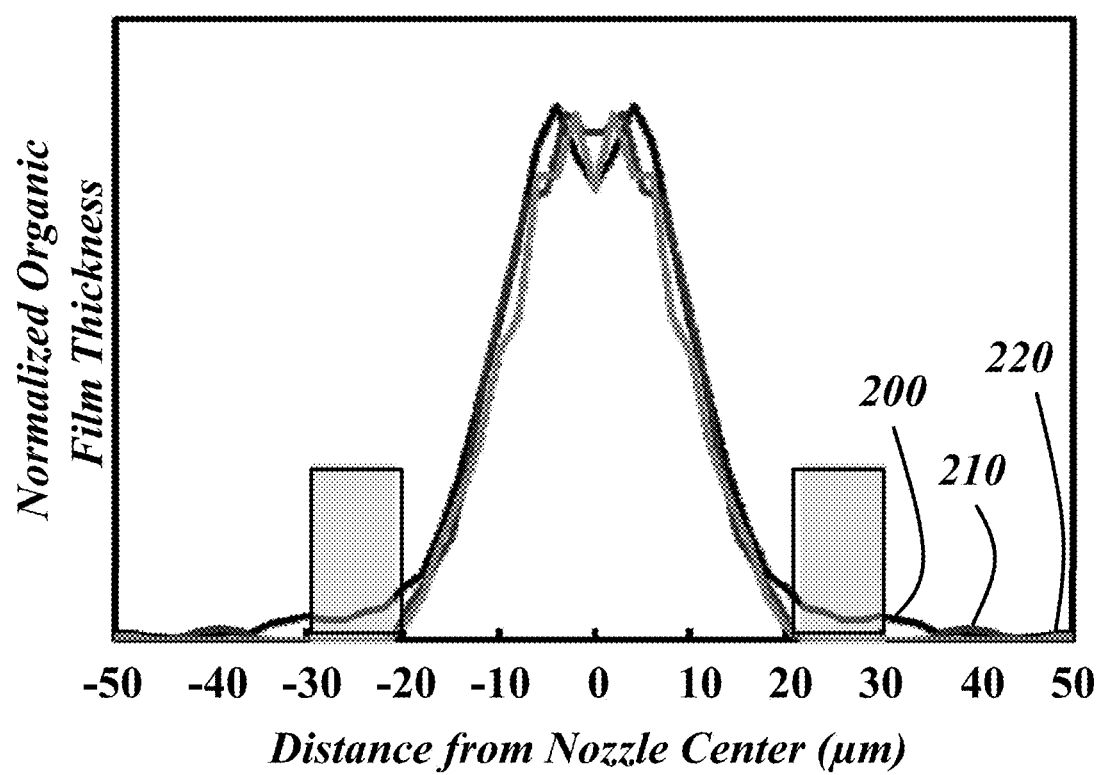
FIG. 6 is a plot of a simulated thickness profile for an OVJ deposited film with and without vapor flow barriers and print head recess features.

FIG. 6 shows the mathematically predicted deposition profile for three cases. Line 200 represents a deposition profile with no vapor flow barriers, line 210 represents the deposition profile with vapor flow barriers, and line 220 represents the deposition profile with vapor flow barriers and recess features such as those shown in FIG. 2. Where employed, the space between the barriers is 40 μm, and each barrier is 2 μm high and 10 μm wide. The chart plots normalized deposited film thickness along the y-axis, and distance from the nozzle center on the x-axis. The simulated nozzle width was 20 μm at the face of the print head, and the distance between the face of the print head and the substrate surface was 10 μm. The rectangular blocks in FIG. 6 represent the location of the barriers along the x-direction.

The profile between the barrier locations is not significant for purposes of this comparison, where the amount of material deposited outside the barrier locations (and presumably over an adjacent pixel location, possibly with a different organic material composition) is being compared. It is notable upon examination of line 210 that the barriers cast a 10 μm shadow past their distal ends within which virtually no material is deposited. A relief trench (such as features 110 of FIG. 2) etched into the nozzle membrane (i.e., the print head face) provides an escape path for organic material deflected by but not adsorbed to the barrier. This eliminates nearly all deposition past the barrier, as shown by the line 220.

It is to be understood that the foregoing description is of one or more embodiments of the invention. The invention is not limited to the particular embodiment(s) disclosed herein, but rather is defined solely by the claims below. Furthermore, the statements contained in the foregoing description relate to the disclosed embodiment(s) and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation.

The invention claimed is:

1. An organic optoelectronic device (OED), comprising:
a substrate having an OED cell support surface;
an OED cell located at an OED cell area along the support surface, the OED cell including a layer of vapor printed small-molecule organic material arranged between first and second electrodes; and
a vapor flow barrier extending away from the support surface alongside the OED cell and arranged to contain the small-molecule organic material within the OED cell area, wherein the layer of vapor printed small-molecule organic material is deposited with a combination of processing conditions over the OED cell area along one side of the vapor flow barrier via a jet of gas directed toward the support surface from a vapor printing nozzle, the jet of gas comprising the small-molecule organic material, and
wherein the vapor flow barrier extends away from the support surface to a height that is sufficiently large to prevent the small-molecule organic material from being deposited over the support surface at an opposite side of the vapor flow barrier at the combination of processing conditions.

2. An organic OED as defined in claim 1, further comprising:
a plurality of OED cells arranged along the support surface, each cell including a small-molecule organic layer located between first and second electrodes, wherein the organic layer of at least one of the cells has a different composition than the organic layer of an adjacent cell;
wherein the vapor flow barrier extends between the adjacent cells that have organic layers with different compositions.

3. An organic OED as defined in claim 2, wherein each OED cell is an organic light-emitting diode (OLED) and the different compositions correspond to different colors when the OLEDs are illuminated.

4. An organic OED as defined in claim 3, further comprising:
a plurality of pixels, each pixel comprising two or more different color OLEDs as subpixels with vapor flow barriers located between adjacent subpixels and between adjacent pixels.

5. An organic OED as defined in claim 1, wherein the vapor flow barrier has a curved cross-section.

6. An organic OED as defined in claim 1, wherein the vapor flow barrier includes an undercut.

7. An organic OED as defined in claim 1, wherein said height is such that the vapor flow barrier extends away from the support surface beyond the layer of organic material.

8. An organic OED as defined in claim 1, wherein said height is in a range from 0.5 to 4.0 μm.

9. An organic OED as defined in claim 1, said vapor flow barrier being a first vapor flow barrier, the organic OED further comprising a second vapor flow barrier located alongside the OED cell, wherein the second vapor flow barrier extends away from the support surface to a height that is sufficiently large to prevent the small-molecule organic material from being deposited over the support surface at an opposite side of the second vapor flow barrier at the combination of processing conditions.

10. An organic optoelectronic device (OED), comprising:
a substrate having an OED cell support surface;
an OED cell located at an OED cell area along the support surface, the OED cell including a layer of small-molecule organic material arranged between first and second electrodes;
a first vapor flow barrier located along a first side of the OED cell and extending away from the support surface to a first height; and
a second vapor flow barrier located along a second adjacent side of the OED cell and extending away from the support surface to a second height, wherein both of the first and second heights are such that both of the vapor flow barriers extend away from the support surface beyond the layer of organic material.

11. An organic optoelectronic device (OED) as defined in claim 10, wherein the layer of small-molecule organic material is deposited with a combination of processing conditions over the OED cell area along one side of each of the vapor flow barriers via a jet of gas directed toward the support surface from a vapor printing nozzle, the jet of gas comprising the small-molecule organic material, and
wherein each of said first and second heights is sufficiently large to prevent the small-molecule organic material from being deposited over the support surface at respective opposite sides of the first and second vapor flow barriers at the combination of processing conditions.

12. An organic OED as defined in claim 10, further comprising:
a plurality of OED cells arranged along the support surface, each cell including a small-molecule organic layer located between first and second electrodes, wherein at least one of the first or second vapor flow barriers extends between adjacent cells having organic layers of different compositions.

13. An organic OED as defined in claim 12, wherein each OED cell is an organic light-emitting diode (OLED) and the different compositions correspond to different colors when the OLEDs are illuminated.

14. An organic OED as defined in claim 13, further comprising:
a plurality of pixels, each pixel comprising two or more different color OLEDs as subpixels with vapor flow barriers located between adjacent subpixels and between adjacent pixels.

15. An organic OED as defined in claim 10, wherein at least one of the vapor flow barriers has a curved cross-section.

16. An organic OED as defined in claim 10, wherein at least one of the vapor flow barriers includes an undercut.

17. An organic OED as defined in claim 10, wherein at least one of said heights is in a range from 0.5 to 4.0 μm.

* * * * *